(12) United States Patent
Bäcklund et al.

(10) Patent No.: US 10,804,863 B2
(45) Date of Patent: Oct. 13, 2020

(54) SYSTEM AND METHOD FOR AMPLIFYING AND COMBINING RADIOFREQUENCY POWER

(71) Applicant: General Electric Company, Schenectady, NY (US)

(72) Inventors: Andreas Bäcklund, Uppsala (SE); Dragos Dancila, Uppsala (SE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 16/199,740

(22) Filed: Nov. 26, 2018

(65) Prior Publication Data
US 2020/0169229 A1 May 28, 2020

(51) Int. Cl.
*H03F 3/189* (2006.01)
*H03F 3/60* (2006.01)
*H03F 1/56* (2006.01)
*H03F 3/24* (2006.01)

(52) U.S. Cl.
CPC .............. *H03F 3/189* (2013.01); *H03F 1/56* (2013.01); *H03F 3/24* (2013.01); *H03F 3/602* (2013.01); *H03F 2200/423* (2013.01); *H03F 2200/451* (2013.01)

(58) Field of Classification Search
USPC .............. 330/295, 124 R, 84, 286, 302, 305
See application file for complete search history.

(56) References Cited

U.S. PATENT DOCUMENTS

| | | | |
|---|---|---|---|
| 2,124,029 A | 7/1938 | Conklin et al. |
| 2,181,871 A | 12/1939 | Conklin |
| 2,540,634 A | 2/1951 | Starner et al. |
| 4,034,320 A | 7/1977 | Heckman, Jr. et al. |
| 4,292,610 A | 9/1981 | Makimoto |
| 4,494,087 A | 1/1985 | Dydyk et al. |

(Continued)

OTHER PUBLICATIONS

Carter "RF Power Generation" Lancaster University (35 pages).
(Continued)

*Primary Examiner* — Hieu P Nguyen
(74) *Attorney, Agent, or Firm* — The Small Patent Law Group LLC; Dean D. Small (57) ABSTRACT

System includes first and second amplifying circuits that are configured to receive input signals having a fundamental frequency. The system also includes first and second transmission lines that are configured to receive voltage and current waveforms from the first and second amplifying circuits, respectively. The system also includes a capacitively-compensated transmission line resonator (CC-TLR) that is configured to be electrically connected to a load having a load impedance. The CC-TLR is configured to receive and combine RF power from the first and second transmission lines. The CC-TLR has a compensation capacitance that causes the CC-TLR to present an open circuit at the fundamental frequency and present a short circuit at harmonic frequencies. Optionally, a characteristic impedance ($Z_0$) of the first and second transmission lines and a load impedance ($Z_L$) are unequal, and the first and second transmission lines cause a load impedance transformation.

20 Claims, 6 Drawing Sheets

(56) References Cited

U.S. PATENT DOCUMENTS

| | | | |
|---|---|---|---|
| 5,274,341 A * | 12/1993 | Sekine | H03F 3/604 330/269 |
| 5,614,875 A | 3/1997 | Jang et al. | |
| 6,396,366 B1 | 5/2002 | Raty et al. | |
| 6,937,096 B2 | 8/2005 | Wight et al. | |
| 2015/0318600 A1 | 11/2015 | Gudovich et al. | |
| 2017/0317654 A1 | 11/2017 | Velzaco | |

OTHER PUBLICATIONS

Liu et al "A Method for Designing the Variable-Way High-Power Cavity Combiner" Chinese Physical Society; 2016 (6 pages).

Fadden "Solid State Power Amplifier Combiners for Accelerator Applications" School of Electrical and Computer Engineering (7 pages).

Dancila et al. "A Compact 10 kW Solid-State RF Power Amplifier at 352 MHz" 8th International Particle Accelerator Conference; 2017 (8 pages).

Microwave Vision Grout "Radial Power Combiners—Model Number" MVG; 2013 (4 pages).

Getta et al. "Modular High Power Solid State RF Amplifiers for PArticle Accelerators" Proceedings of PAC09 (3 pages).

* cited by examiner

SYSTEM AND METHOD FOR AMPLIFYING AND COMBINING RADIOFREQUENCY POWER

BACKGROUND

The subject matter herein relates generally to a system that amplifies and combines radiofrequency (RF) power.

High-power RF systems that operate at a designated frequency or within a frequency range are used within various technological fields, such as communication, industrial processing, medical imaging, and physics-related research. For example, particle accelerators may include power generators that provide a considerable amount of RF power (e.g., 5 kilowatts to 2 megawatts) to create electrical fields for accelerating particles.

RF power amplifiers increase the power of an input signal. Such amplifiers are generally characterized as one of two types, linear or non-linear, and can be further divided into "classes" in which each class has one or more advantages or disadvantages, depending upon the desired application. Linear amplifiers provide an output signal (power) that is directly proportional to the input signal but at a higher power level. Classes A, AB, and B can be examples of linear amplifiers. Non-linear amplifiers provide an output signal that is not directly proportional to the input signal. Classes D, E, and F can be examples of non-linear amplifiers. Such amplifiers use switching devices (e.g., transistors) and circuits for filtering harmonics. Non-linear amplifiers can offer better efficiency and higher output power compared to linear amplifiers. Class-F amplifiers, in particular, have gained more interest in recent years due to their comparatively higher efficiencies and due to the increased availability of fast-switching transistors and linearization techniques.

For some applications and circumstances, it may be necessary to combine RF power from multiple sources. RF power combining can be a complex process that addresses various challenges, including impedance transformation and matching, losses, bandwidth, and power limitations. The size of the RF power combiner is another challenge, especially for applications in which the frequency range is less than 300 megahertz (MHz). The size of the RF power combiner is proportional to the wavelength, and the wavelength for 300 MHz or less is relatively large (e.g., one meter or more).

Power amplification and power combining typically occur at discreet stages by separate devices, each of which can involve several components. RF power amplifiers and combiners have conventionally been designed to connect to systems with a nominal characteristic impedance of 50-ohm. While the 50-ohm standard can be convenient, it can also lead to design challenges. Overcoming these challenges for many applications can increase the complexity, loss, and cost of the system, especially if the application requires a system with several amplifiers that operate in the lower RF frequency bands (e.g., less than 300 MHz).

For example, impedance transformation and harmonic control circuits of an RF power amplifier are usually included on a printed circuit board (PCB) or other modular device. It is convenient to implement tuning elements, or filters, as sections of transmission lines (e.g., microstrips or strip lines) on the PCB. At lower frequencies and/or higher power levels, however, the transmission lines become too large for a PCB and/or too lossy. Alternative methods can also be impracticable due to size or losses.

BRIEF DESCRIPTION

In an embodiment, a system is provided that includes first and second amplifying circuits that are configured to receive input signals having a fundamental frequency. The first and second amplifying circuits have respective switching devices configured to provide voltage and current waveforms. The system also includes first and second transmission lines that are configured to receive the voltage and current waveforms from the first and second amplifying circuits, respectively. Electrical lengths of the first and second transmission lines are a quarter-wavelength of the fundamental frequency. The system also includes a capacitively-compensated transmission line resonator (CC-TLR) that is configured to be electrically connected to a load having a load impedance. The CC-TLR is configured to receive and combine RF power from the first and second transmission lines. The CC-TLR has a compensation capacitance that causes the CC-TLR to present an open circuit at the fundamental frequency and present a short circuit at harmonic frequencies.

In some aspects, the characteristic impedance ($Z_0$) of the first and second transmission lines and the load impedance ($Z_L$) are unequal, and the first and second transmission lines cause a load impedance transformation. In other aspects, the characteristic impedance ($Z_0$) of the transmission line and the load impedance ($Z_L$) are equal.

In some aspects, the CC-TLR is resonant at the fundamental frequency. The compensation capacitance reduces a length of the CC-TLR. Optionally, the fundamental frequency is between 10 megahertz (MHz) and 300 MHz.

In some aspects, the compensation capacitance of the CC-TLR adjusts the resonance of the CC-TLR to resonate in between adjacent harmonic frequencies of the fundamental frequency.

In some aspects, the system also includes at least one additional amplifying circuit and a respective transmission line for each additional amplifying circuit. The respective transmission line configured to receive voltage and current waveforms from the additional amplifying circuit. An electrical length of respective transmission line is a quarter-wavelength of the fundamental frequency. The CC-TLR is configured to receive and combine RF power from the first and second transmission lines and the respective transmission line(s) from the at least one additional amplifying circuit.

In some aspects, the CC-TLR includes an inner conductor, an outer conductor that surrounds the inner conductor, and a cavity between the inner conductor and the outer conductor. The inner conductor and the outer conductor are electrically connected at a proximal end of the CC-TLR. The CC-TLR also includes a capacitive element connected to at least one of the inner conductor or the outer conductor. The capacitive element capacitively couples the inner conductor and the outer conductor. Optionally, the capacitive element capacitively couples the inner conductor and the outer conductor at a distal end of the CC-TLR.

Optionally, the CC-TLR extends lengthwise along a longitudinal axis. The capacitive element includes a first conductive surface that is electrically connected to the inner conductor and a second conductive surface that is electrically connected to the outer conductor. The first and second conductive surfaces face each other and are separated by a gap, wherein at least one of a gas (e.g., predetermined gas or gases) or a dielectric material is disposed within the gap.

In some aspects, each of the first and second transmission lines includes a plurality of transmission lines having different characteristic impedances and that are connected in series.

In an embodiment, a system is provided that includes an amplifying circuit configured to receive input signals having a fundamental frequency. The amplifying circuit has a switching device configured to provide voltage and current waveforms. The system also includes a transmission line configured to receive the voltage and current waveforms from the amplifying circuit. An electrical length of respective transmission line is a quarter-wavelength of the fundamental frequency. The system also includes a capacitively-compensated transmission line resonator (CC-TLR) configured to be electrically connected to a load having a load impedance. The CC-TLR is configured to receive RF power from the transmission line. The CC-TLR has a compensation capacitance that causes the CC-TLR to present an open circuit at the fundamental frequency and present a short circuit at harmonic frequencies.

In some aspects, the characteristic impedance ($Z_O$) of the respective transmission line and the load impedance ($Z_L$) are unequal, and the respective transmission line causes a load impedance transformation. In other aspects, the characteristic impedance ($Z_O$) of the respective transmission line and the load impedance ($Z_L$) are equal.

In some aspects, the CC-TLR is resonant at the fundamental frequency. Optionally, the fundamental frequency is between 10 megahertz (MHz) and 300 MHz.

In some aspects, the transmission line includes a plurality of transmission lines having different characteristic impedances and connected in series.

In some aspects, the CC-TLR includes an inner conductor, an outer conductor that surrounds the inner conductor, and a cavity between the inner conductor and the outer conductor. The inner conductor and the outer conductor are electrically connected at a proximal end of the CC-TLR. The CC-TLR also includes a capacitive element connected to at least one of the inner conductor or the outer conductor. The capacitive element capacitively couples the inner conductor and the outer conductor. Optionally, the capacitive element capacitively couples the inner conductor and the outer conductor at a distal end of the CC-TLR In some aspects, the CC-TLR extends lengthwise along a longitudinal axis. The capacitive element includes a first conductive surface that is electrically connected to the inner conductor and a second conductive surface that is electrically connected to the outer conductor. The first and second conductive surfaces face each other and are separated by a gap, wherein at least one of a gas (e.g., predetermined gas or gases) or a dielectric material is disposed within the gap.

In an embodiment, a method is provided that includes receiving input signals at a respective switching device of a first amplifying circuit and a respective switching device of a second amplifying circuit. The respective switching devices of the first and second amplifying circuits provide voltage and current waveforms. The method also includes receiving the voltage and current waveforms from the first and second amplifying circuits at first and second transmission lines, respectively. Electrical lengths of the first and second transmission lines are a quarter-wavelength of the fundamental frequency. The method also includes combining RF power from the first and second transmission lines using a capacitively-compensated transmission line resonator (CC-TLR). The CC-TLR has a compensation capacitance that causes the CC-TLR to present an open circuit at the fundamental frequency and present a short circuit at harmonic frequencies. The CC-TLR is configured to be connected to a load.

In some aspects, the characteristic impedance ($Z_O$) of the first and second transmission lines and the load impedance ($Z_L$) are unequal, and the first and second transmission lines cause a load impedance transformation. In other aspects, the characteristic impedance ($Z_O$) of the first and second transmission lines and the load impedance ($Z_L$) are equal.

In some aspects, the CC-TLR is resonant at the fundamental frequency and the fundamental frequency is between 10 megahertz (MHz) and 300 MHz.

DETAILED DESCRIPTION

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry.

As used herein, an element or step recited in the singular and proceeded with the word "a" or "an" should be understood as not excluding plural of said elements or steps, unless such exclusion is explicitly stated, such as by stating "only a single" element or step. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments set forth herein include systems for providing radio-frequency (RF) power. The systems may be referred to as power-generation systems or power generators. Embodiments may include components for amplifying and combining RF power from multiple sources and providing the RF power to one or more loads. Conventional RF power amplifiers typically include an input network that receives the input signal and an output network. The output network for a non-linear amplifier matches impedance and removes harmonic components before the RF power is provided to the power combiner. Unlike prior systems that use separate devices for amplifying the RF power and then combining the RF power, embodiments may utilize a single device that forms a part of the matching networks of the amplifiers and combines the RF power. As such, embodiments may lead to increased integration and reduce the number of components, loss, size, and total cost for the system.

Particular embodiments include a capacitively-compensated transmission line resonator (CC-TLR) that functions as both a filter and a power combiner. In certain embodiments, the CC-TLR includes an open-ended inner conductor, an outer conductor that surrounds the inner conductor, and a cavity that is defined between the inner conductor and the outer conductor. A capacitive element capacitively couples the inner and outer conductors. The CC-TLR may be resonant at the fundamental frequency. The CC-TLR may be based on a quarter-wavelength (QW or $\lambda/4$) transmission line resonator or a half-wavelength (HW or $\lambda/2$) transmission line resonator, but the CC-TLR may be shorter than QW or HW using the capacitive element as described herein.

In some embodiments, the CC-TLR is a coaxial transmission line resonator. CC-TLRs with a coaxial transmission line may be configured for numerous coupling elements (e.g., input and output coupling elements) and multiple different types of coupling elements (e.g., inductive, capacitive, tapped-in). CC-TLRs with a coaxial transmission line may also be configured for a designated ratio of impedance transformation between the power source and the load.

At least some embodiments may be characterized as being high-power. As used herein, the term "high-power" means greater than 3,000 W. Particular embodiments may manage five (5) kilowatts or more or ten (10) kilowatts or more. Embodiments may be particularly suitable for operating frequencies (or fundamental frequencies) that are between 10 megahertz (MHz) and 300 MHz. But it is also contemplated that other embodiments may have an operating frequency that is greater than 300 MHz or less than 10 MHz.

A technical effect provided by one or more embodiments may include amplifying and combining RF power using fewer components than systems that amplify and combine the RF power at separate stages. Another technical effect provided by one or more embodiments may include a relatively compact design that occupies less space than known systems that amplify RF power and combine RF power. Another technical effect provided by one or more embodiments may include amplifying RF power and combining RF power from numerous sources (e.g., four, ten, twenty, or more). Another technical effect provided by one or more embodiments may include amplifying RF power and combining RF power at a relatively low operating frequency, such as 300 MHz or less. Another technical effect provided by one or more embodiments may include impedance transformation.

Accordingly, in particular embodiments, a high-power generation system for amplifying and combining RF power at an operating frequency of 300 MHz or less may be integrated with solid state technology (e.g., a laterally diffused metal oxide semiconductor (LDMOS) or an insulated gate bipolar transistor (IGBT)), wherein the system combines the RF power from numerous sources. Embodiments described herein may include RF power generators. The RF power generators may be used by particle accelerators (e.g., physics-related research or manufacturing radioisotopes) or for communication (e.g., broadcast antennas) or industrial processing (e.g., inductive heaters).

Although some embodiments may be used to combine RF power from multiple sources and transform a load impedance seen by a switching device that receives the input signal, it is contemplated that one or more embodiments may receive RF power from only a single source. In such a system, the CC-TLR may be used to transform the impedance seen at the output port of the switching device.

As used herein, the term "load impedance" means the impedance seen looking out of the output port of a device or component or network thereof, having at least two ports, one of which being an output port, or the impedance seen looking into the input port of a load having a load impedance. The "output port" of a device or component or network thereof is the port facing toward the load.

Figure 1:
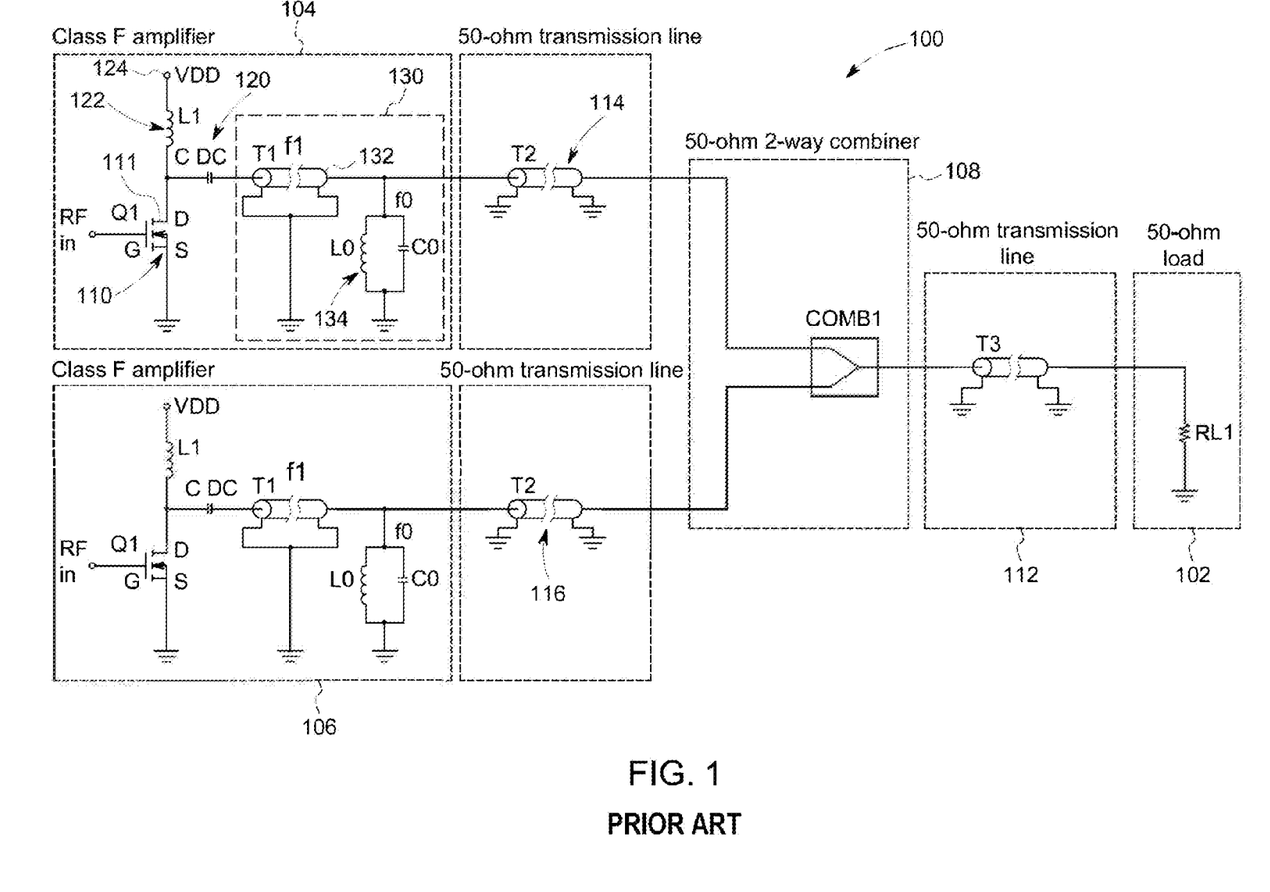
FIG. 1 is a circuit diagram of a conventional system that provides radiofrequency (RF) power to a load using multiple amplifier modules and a separate power combiner.

FIG. 1 is a circuit diagram of a conventional system 100 that provides RF power to a load 102 using multiple amplifier modules 104, 106 and a power combiner 108. The amplifier modules 104, 106 connect to the power combiner 108 through transmission lines 114, 116, respectively. The power combiner 108 connects to the load 102 through a transmission line 112. It is noted that the circuit in FIG. 1 is a simplified (or an idealized) design and that other components, such as those compensating for parasitics and component-to-component variation, may be used. The following description provides more detail with respect to the amplifier module 104, but the description can be equally applicable to the amplifier module 106.

The system 100 has a fundamental (or operating) frequency and the amplifier modules 104, 106 are designed to filter harmonics. The amplifier modules 104, 106 in FIG. 1 illustrate an ideal class-F topology in which an output network 130 forms a short circuit at even-order harmonics and an open circuit at the odd-order harmonics. The output network 130 may also be referred to as an output tuning network or matching network. In other embodiments, the amplifier modules 104, 106 may be configured to have an inverse class-F topology, wherein the output network 130 provides a short circuit at the odd-order harmonics and an open circuit at the even-order harmonics.

Each of the amplifier modules 104, 106 includes a switching device, here a field-effect transistor (FET) transistor 110 having a drain 111, a capacitor 120, an inductor choke 122, and a direct current (DC) power supply 124. As used herein, a switching device may include a bilateral switch, such as the FET transistor, or other mechanism/circuitry for performing the switching operation (e.g., relay) as described herein. In the illustrated embodiment, the FET transistor 110 is alternately driven into saturation and cut-off regions by an input signal and is therefore operated as a switching device. The capacitor 120 blocks DC voltage but presents a short circuit for all RF frequencies. The inductor choke 122 presents an open circuit for all RF frequencies, thereby blocking the RF signals from the DC power supply 124.

Each of the amplifier modules 104, 106 also includes an output network 130 that is configured to filter the signal and prevent harmonic power from being delivered to the load or the source. The output network 130 is designed to obtain non-overlapping drain waveforms (voltage and current) of the FET transistor 110 by presenting an open circuit or a short circuit at the drain 111. For example, the output network 130 may be configured to present an open (high impedance) for odd harmonics at the drain 111 and present a short at the drain 111 for even harmonics. The term "open" or "open circuit" may mean, for example, an impedance at the drain that is at least three times (3X) (e.g., ten times (10X)) the fundamental-frequency impedance, and the term "short" or "short circuit" may mean an impedance at the drain that is no more than one-third ($\frac{1}{3}$) (e.g., $\frac{1}{10}$) of the fundamental-frequency impedance. In the above example, the output network 130 controls the harmonics to yield minimally overlapping voltage and current waveforms. For example, the output network 130 may control the harmonics to yield a square-shaped voltage waveform and a half-wave sinusoidal current waveform that is 180° out-of-phase with respect to the voltage waveform.

Alternatively, the output network 130 may have an inverse design and be configured to present an open at the drain 111 for even harmonics and present a short at the drain 111 for odd harmonics. For the inverse configuration, the output network 130 controls the harmonics to yield minimally overlapping voltage and current waveforms. For example, the output network 130 may control the harmonics to yield a square-shaped current waveform and a half-wave sinusoidal voltage waveform that is 180° out-of-phase with respect to the current waveform.

In either the output network 130 of FIG. 1 or the inverse configuration, the output network 130 includes a transmission line 132 and a tank circuit 134 that are configured to filter power at harmonic frequencies. In FIG. 1, the transmission line 132 is a QW transmission line at the fundamental frequency and is resonant at odd harmonics. The tank circuit 134 is resonant at the fundamental frequency where it will present an open circuit, while presenting a short circuit to ground at even harmonics and odd harmonics.

In the illustrated embodiment, the transmission line 132 will transform the short circuit of the tank circuit 134 to an open circuit at odd harmonics. At even harmonics, the transmission line 132 is at a multiple of a half-wavelength and no impedance transformation will appear. As such, the transmission line 132 will present a repetitive short circuit for even harmonics and a repetitive open circuit for odd harmonics at the drain 111 of the FET transistor 110. At the fundamental frequency, where the tank circuit 134 will present an open circuit, the impedance seen at the drain 111 of the FET transistor 110 will be that of the load on the output of the amplifier module 104. The load may be selected based upon the application.

Figure 2:
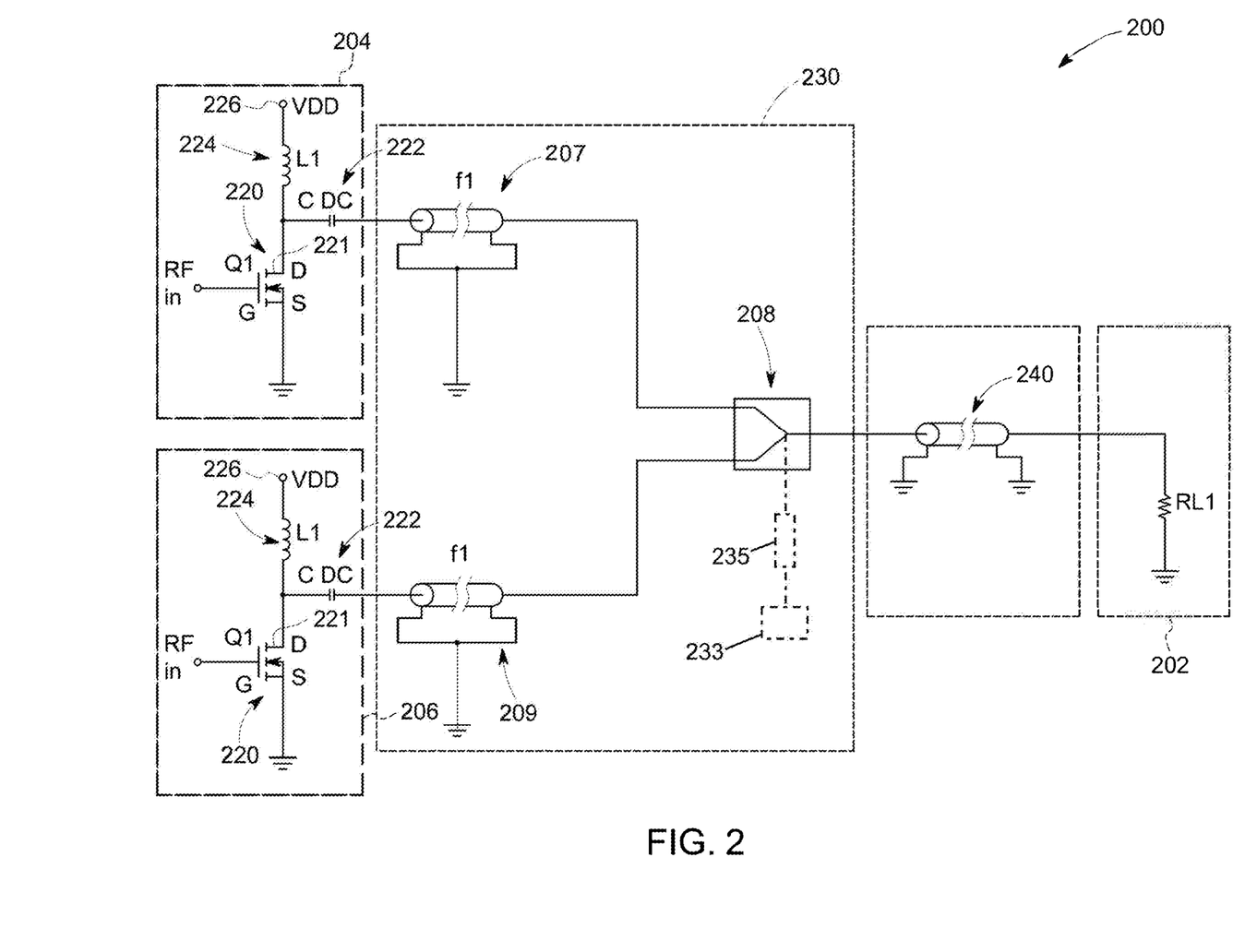
FIG. 2 is a circuit diagram of a system formed in accordance with an embodiment that is configured to amplify and combine RF power for a load.

FIG. 2 is a circuit diagram of a system 200 formed in accordance with an embodiment that is configured to provide RF power to a load 202. The system 200 includes first and second amplifying circuits 204, 206, first and second transmission lines 207, 209 and a single power-combining circuit 208. The power-combining circuit 208 may be a CC-TLR, as described herein, for one or more embodiments. The CC-TLR may replace the tank circuit in the class-F topology, such as the tank circuit 134 described above with respect to FIG. 1. The power-combining circuit 208 is connected to the load 202 through a transmission line 240. In some embodiments, the fundamental frequency of the system 200 is between 10 MHz and 300 MHz. In other embodiments, however, the fundamental frequency may be greater than 300 MHz.

The system 200 shown in FIG. 2 is an exemplary (or idealized) design and may include other components, such as devices for parasitics compensation and component-to-component variation. Although FIG. 2 shows only two amplifying circuits with some specificity, it should be understood that more than two amplifying circuits may be connected to the power-combining circuit 208. More specifically, the system 200 may include at least one additional amplifying circuit (indicated generally by the reference number 233) and a respective transmission line 235 for each additional amplifying circuit. Similar to the amplifying circuits and transmission lines of the system 100 described above, the respective transmission lines 207, 209, receive voltage and current waveforms from the corresponding amplifying circuits. The power-combining circuit 208 is configured to receive and combine RF power from the transmission lines. For example, the number of amplifying circuits (or transmission lines) may be three, four, five, six, eight, ten, twenty, fifty, or more. For applications in which the characteristic impedance of the transmission line(s) and the load impedance are unequal, the transmission line(s) can cause a load impedance transformation.

The system 200 may include more than one power-combining circuit 208. Moreover, the power-combining circuit 208 may be connected to more than one load 202. For example, a single power-combining circuit 208 may receive RF power from sixteen (16) amplifying circuits and provide RF power to two loads. In yet other embodiments, the power-combining circuit 208 may be connected to only one amplifying circuit. In such instances, the circuit 208 may be used for impedance transformation and, as such, may be referred to as an impedance-transformation circuit 208.

As shown, each of the first and second amplifying circuits 204, 206 includes a switching device 220 a capacitor 222, an inductor choke 224, and a DC power supply 226. The capacitor 222 presents a short circuit for all RF frequencies. The inductor choke 224 presents an open circuit for all RF frequencies to block the RF signals from the DC power supply 226. In the illustrated embodiment, the switching device is a FET transistor having a drain 221. The switching device 220 may be referred to as a FET transistor 220 in the following description. The FET transistors 220 are alternately driven into saturation and cut-off regions by an input signal so to generate harmonics and cause the drain voltage and current to be 180° out-of-phase.

Each of the first and second transmission lines 207, 209 is configured to receive the voltage and current waveforms from the first and second amplifying circuits 204, 206, respectively. Electrical lengths of the first and second transmission lines 207, 209 are a quarter-wavelength of the fundamental frequency. The first and second transmission lines 207, 209 and the power-combining circuit 208 form an output network 230 that presents an open circuit or a short at the drain 221 on harmonics to obtain non-overlapping drain waveforms (voltage and current) from the drain 221 of the FET transistor 220. Specifically, the output network 230 presents an open circuit for odd harmonics at the drain 221 and presents a short circuit at the drain 221 for even harmonics.

In some embodiments, the first and second transmission lines 207, 209 may be used to transform the load impedance to a different amount at the FET transistor 220. For example, a desired load impedance at the FET transistor 220 may be much lower than the load impedance at the first and second transmission lines (e.g. much lower than 50 ohms). For example, the load impedance at the FET transistor 220 may be less than 10 ohms, or, more particularly, less than 1 ohm. This feature may be used to adjust performance of the system 200.

The power-combining circuit 208 (e.g., CC-TLR), when connected to the first and second transmission lines 207, 209 (and possibly more), is configured to present an open circuit at the fundamental frequency and present a short circuit at harmonic frequencies. Accordingly, the power-combining circuit 208 is resonant at the fundamental frequency and presents an open circuit at the fundamental frequency, while presenting a short circuit to ground at even harmonics and odd harmonics. However, at odd harmonics the first and second transmission lines 207, 209 are each a multiple of a quarter-wavelength and hence will transform the short of the power-combining circuit 208 to be an open circuit at the drain 221 of the FET transistor 220. At even harmonics, the first and second transmission lines 207, 209 are each a multiple of a half-wavelength and no impedance transformation will appear. As such, the first and the second transmission lines 207, 209, will present a repetitive short circuit for even harmonics and a repetitive open circuit at for odd harmonics at the drain 221 of the FET transistor 220. At the fundamental frequency, the load impedance will be transformed by the first and second transmission lines 207, 209, according to the quarter-wavelength ($\lambda/4$) impedance-transformation equation given by:

$$Z_{in} = Z_0^2 / Z_L$$

wherein $Z_{in}$ is the impedance seen at the switching device side 221 of the transmission line 207 or 209 (e.g., input impedance), $Z_0$ is the characteristic impedance of the transmission line 207 or 209, and $Z_L$ is the load impedance at the combiner side of the transmission line 207 or 209 (e.g. output impedance). Accordingly, the input impedance will be equal to the characteristic impedance of the transmission line squared, then divided by the load impedance at the combiner side. The impedance will be transformed in all cases, except when the characteristic impedance of the transmission line, $Z_0$, equals the load impedance, $Z_L$, for which the input impedance, $Z_{in}$, will be the same as the load impedance, $Z_L$. Whether to use the transmission line or the power-combining circuit (or both) for load impedance matching may be based on the application or end-use of the RF power.

Unlike the system 100 in FIG. 1, the amplification and power-combination steps or operations do not occur independently. Instead, operation of the FET transistors 220 are based upon characteristics of the power-combining circuit 208 and the electrical lengths of the first and second transmission lines 207, 209. The components that amplify and combine the RF power are functionally integrated.

The physical dimensions of the first and second transmission lines 207, 209, such as a length, will determine a maximum distance between the switching device 220 and the power-combining circuit 208. In other words, the size of the first and second transmission lines 207, 209 will determine how far away from each other the FET transistor 220 and the power-combining circuit 208 may be positioned. Thus, an upper frequency limit exists where the length would be too short even if the switching device 220 is positioned directly adjacent to the power-combining circuit 208. However, this upper frequency limit may be increased if each of the first and second transmission lines 207, 209 includes two or more cascaded quarter-wavelength transmission lines having different characteristic impedance ($Z_0$). Accordingly, the term "transmission line" as used in the claims, is not limited to only a single transmission line but may include two or more cascaded transmission lines.

In some embodiments, a load of nearly any impedance (e.g., as low as 0.1 ohm or as high as several kilo-ohms or even mega-ohms) may be connected directly to the power-combining circuit 208, thereby eliminating the transmission line 240. In this case, the load and the power-combining circuit 208 should be directly connected to each other. As used herein, "directly connected to each other" means the distance between the two is a fraction of the wavelength (e.g., less than or equal to $\lambda/10$). Accordingly, the system 200 may be devoid a transmission line that connects the power-combining circuit and the load. Such embodiments may enable compact systems that can have several power sources and/or loads and operate at low fundamental frequencies.

Figure 3:
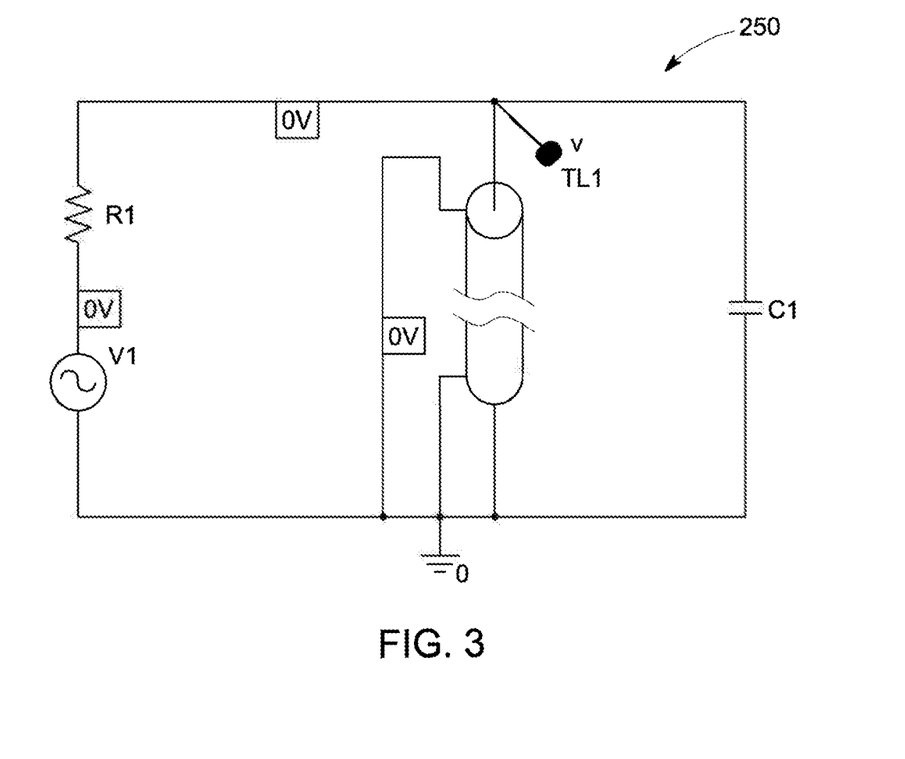
FIG. 3 is a circuit diagram of a capacitively-compensated transmission line resonator that may be used with the system of FIG. 2.
Figure 4:
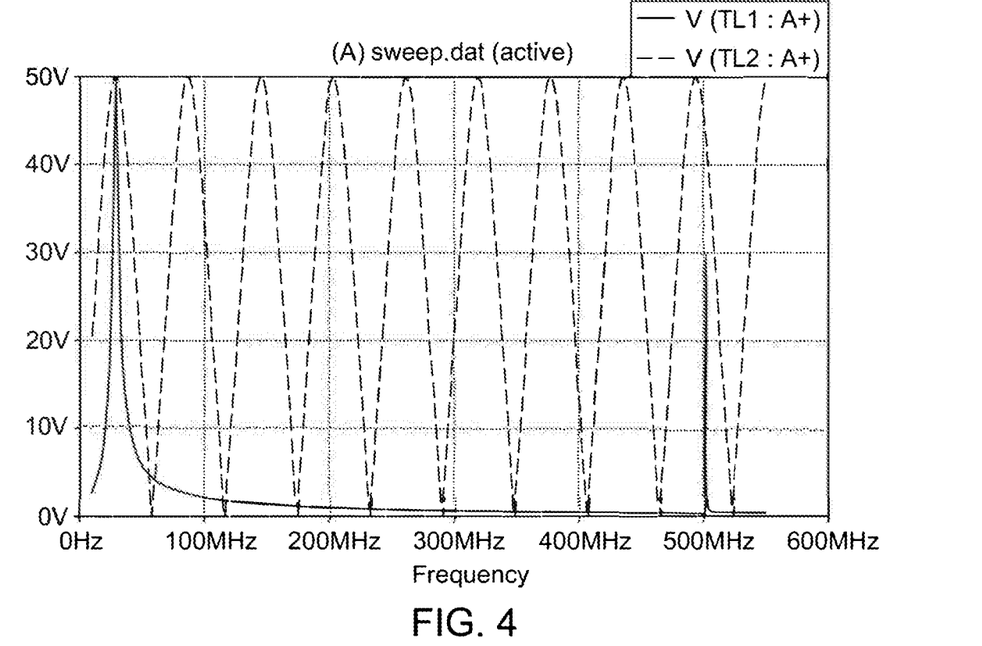
FIG. 4 illustrates simulations for a conventional quarter-wavelength long resonator and a capacitively-compensated transmission line resonator (CC-TLR) formed in accordance with an embodiment.

FIG. 3 is a circuit diagram of a CC-TLR 250 that may be used with the system 200 of FIG. 2. The length of the TLR is 1 nanosecond (ns) and the capacitance is 0.4 nanofarad (nF). In FIG. 4, the dashed line indicates odd-harmonic resonances for a conventional quarter-wavelength transmission line resonator without the added capacitance. The solid line indicates resonances for the CC-TLR 250. Unlike the conventional quarter-wavelength transmission line resonator, the CC-TLR 250 does not resonate repetitively on odd harmonics. As shown, the first resonance appear at 29 MHz and the second resonance for this example has been shifted by the capacitance to a location that is about 500 MHz. The second resonance would have a negligible impact on wave-shaping of the voltage and current. As the capacitance increases, the shift of the higher order resonances increases. However, if the capacitance was less than the capacitance used in the above example, the frequency shift may be made smaller. It may be possible to choose capacitances so that the higher order resonances of the RF power signal are positioned between odd and even harmonics for the fundamental frequency.

Figure 5:
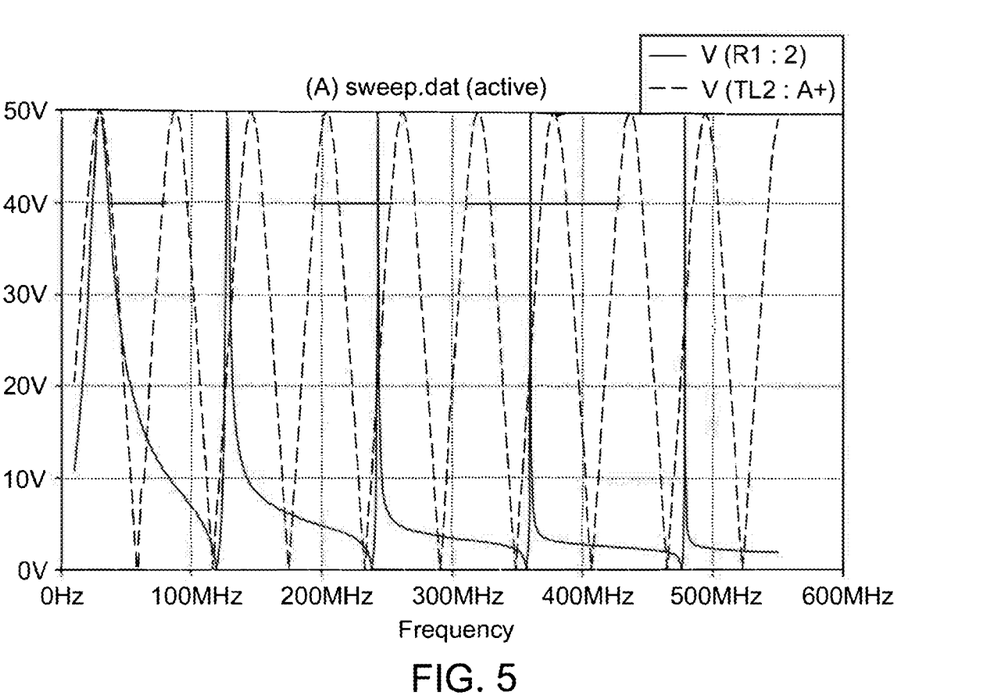
FIG. 5 illustrates simulations for the conventional quarter-wavelength long resonator and a CC-TLR having a different capacitance than the CC-TLR of FIG. 4.

FIG. 5 shows a dashed line for odd-harmonic resonances of a conventional quarter-wavelength transmission line resonator without the added capacitance and a solid line for resonances for a CC-TLR having a smaller capacitance than the capacitance of the CC-TLR 250 of FIG. 3. As shown, the first overtone is positioned at 128 MHz between the $4^{th}$ (116 MHz) harmonic and the $5^{th}$ (145 MHz) harmonic. FIG. 5 also shows that the resonance peaks of the RF power signal becomes narrower as the frequency increases. Consequently, overlap between the odd-harmonic resonances of the fundamental frequency and the resonances of the RF power signal is decreased, which is desirable. Accordingly, a capacitance of the CC-TLR may be selected such that the CC-TLR resonates in between adjacent harmonic frequencies of the fundamental frequency.

FIGS. 4 and 5 illustrate that the CC-TLR described herein may replace the tank circuit in class-F amplifier systems. As such, each of the first and second transmission lines 207, 209 may be used as an interconnecting line (e.g., coaxial cable, strip line, and/or microstrip) from the amplifying circuit to the power-combining circuit (or CC-TLR). More specifically, embodiments may eliminate the conventional 50-ohm transmission lines that typically connect the amplifier to the combiner, such as the transmission lines 114, 116 in FIG. 1.

Figure 6:
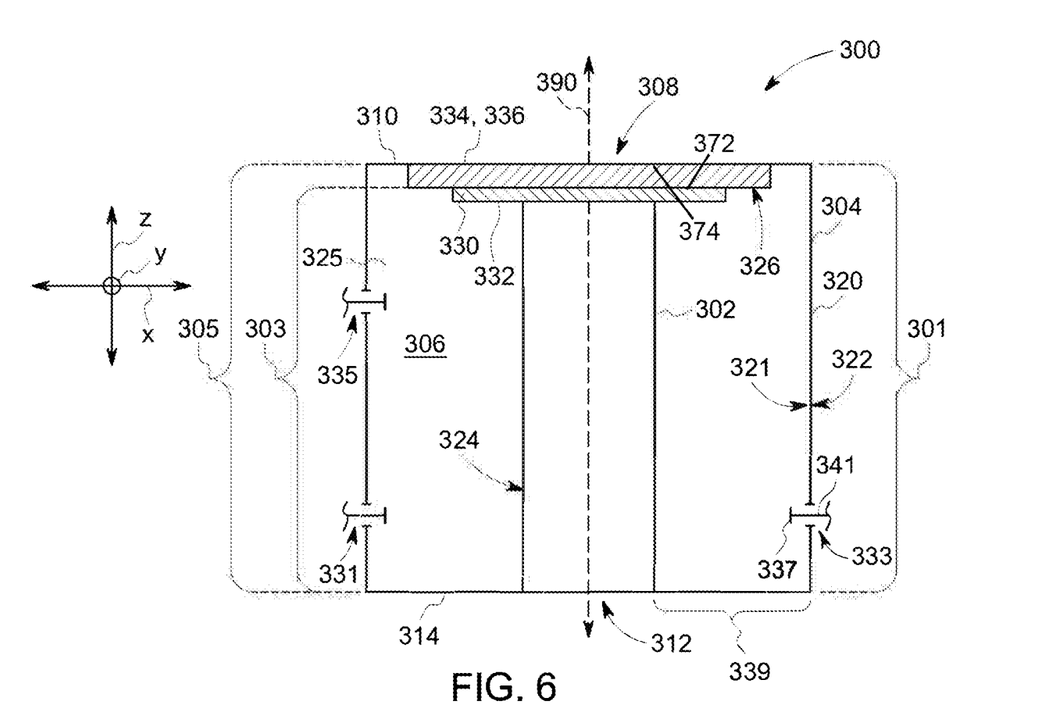
FIG. 6 is a schematic side view of a CC-TLR formed in accordance with an embodiment that may be used with the system of FIG. 2.

FIG. 6 is a schematic side view of a CC-TLR 300 formed in accordance with an embodiment that may be used with the system 200 (FIG. 2). More specifically, the CC-TLR 300 may be the power-combining circuit 208 (FIG. 2) in some embodiments. The CC-TLR 300 has a compensation capacitance that may cause the CC-TLR to present an open circuit at the fundamental frequency and present a short circuit at harmonic frequencies. The CC-TLR 300 may be similar or identical to one or more embodiments described in U.S. application Ser. No. 16/126,726 (325672-1US (553-2061)), filed on Sep. 10, 2018, which is hereby incorporated by reference in its entirety.

As shown in FIG. 6, the CC-TLR 300 is oriented with respect to an X-axis, a Y-axis, and a Z-axis that are mutually perpendicular with one another. During operation, the CC-TLR 300 may have any orientation with respect to gravity. The CC-TLR 300 is capacitively-compensated using a capacitive element 330. Capacitive elements may also be referred to as capacitor assemblies. Capacitive elements have a first conductive surface that is electrically connected to one element (e.g., inner conductor) and a second conductive surface that is electrically connected to another element (e.g., outer conductor). Optionally, a dielectric material may be disposed between the first and second conductive surfaces. The first conductive surface may be, for example, a surface of a coupling plate that is secured to the inner conductor. The second conductive surface may be, for example, a surface of an end wall of the outer conductor or other surface of the outer conductor. The first and second conductive surfaces capacitively couple the inner and outer conductors. The capacitance is a function of the area of the conductive surfaces and a permittivity of the dielectric material (or air gap) between the surfaces. The position of the capacitive element (or capacitor assembly) along the inner conductor may be determined by an amount of the RF voltage within the cavity. In particular embodiments, the capacitive element (or capacitor assembly) is positioned along the inner conductor at or near a maximum of the RF voltage.

As shown in FIG. 6, the CC-TLR 300 includes a transmission line (TL) resonator 301 (or TLR 301) having an inner conductor 302, and outer conductor 304 that surrounds the inner conductor 302, and a cavity 306 therebetween. A longitudinal axis 390 extends through a center of the inner conductor 302 and parallel to the Z-axis. In the illustrated embodiment, the TL resonator 301 also includes a distal end 308 where a distal-end wall 310 is positioned and a proximal end 312 where a proximal-end wall 314 is positioned. As shown, the distal end 308 and the proximal end 312 are at opposite ends of the TL resonator 301. The distal-end and proximal-end walls 310, 314 are mechanically and electrically connected to the outer conductor 304. As shown, the distal-end wall 310 and the proximal-end wall 314 are planar walls that are parallel to each other. In other embodiments, at least one of the distal-end wall 310 or the proximal-end wall 314 is non-planar and/or the distal-end wall 310 and the proximal-end wall 314 are not parallel to one another.

The outer conductor 304 includes a conductive wall 320 having opposite interior and exterior surfaces 321, 322. The inner conductor 302 has a conductive surface 324. The cavity 306 is defined between the conductive surface 324 and the interior surface 321. The CC-TLR 300 includes input coupling elements 331, 333 and an output coupling element 335. As shown, the input coupling elements 331, 333 and the output coupling element 335 are capacitive coupling elements. It should be understood, however, that one or more of the coupling elements 331, 333, 335 may be inductive coupling elements and/or one or more of the coupling elements 331, 333, 335 may be tapped-in coupling elements. There may be more than one output coupling element and more than two input coupling elements in other embodiments. As shown, each of the coupling elements 331, 333, 335 may have a coupling plate 337 positioned within a radial portion 339 of the cavity 306 at a designated distance away from the inner conductor 302. The coupling plate 337 is directly connected to a conductive pathway 341 that extends to a remote location with respect to the CC-TLR 300.

The cavity 306 includes an insulating medium 325. In the illustrated embodiment, the insulating medium 325 may be a vacuum or a designated gas (e.g., ambient air or predetermined gaseous composition). In other embodiments, the insulating medium 325 may have a more solid or solid dielectric material, such as a foam or gel, or may have a mixture of solid and gas. In high-power applications, dimensions of the TL resonator 301 may be relatively large (e.g., tens of centimeters (cm) or more), thereby reducing the electric field strength and the surface current density. In such embodiments, ambient air may be the insulating medium 325.

The inner conductor 302 has an inner-conductor length 303 measured along the Z-axis and the outer conductor 304 has an outer-conductor length 305 measured along the Z-axis. In the illustrated embodiment, the inner-conductor length is 30 cm. The inner-conductor length 303 and the outer-conductor length 305, however, may have other values based on the frequency of operation. For embodiments that do not include a capacitive element 330 and a larger gap 326, the inner-conductor length 303 may be about a quarter of the wavelength at the fundamental resonance frequency (f). For embodiments in which the TL resonator 301 is a QW TL resonator, the TL resonator 301 may be configured to resonate at odd harmonics of the fundamental (f, 3f, 5f, . . . ). For embodiments in which the TL resonator 301 is a half-wavelength TL resonator, the TL resonator 301 may be configured to resonate at odd or even harmonics of the fundamental (f, 2f, 3f, 4f, 5f, . . . ).

The inner and outer conductors 302, 304 have cross-sections taken perpendicular to the Z-axis (or along taken along a XY plane) that may have a variety of cross-sectional shapes (e.g., circular-shape, rectangular-shape, other polygonal shape, etc.). In the illustrated embodiment, dimensions of the inner and outer conductors 302, 304 (e.g., diameter, width, depth) do not change along the Z-axis. As such, the cross-sectional shapes of the inner and outer conductors 302, 304 may be uniform along the Z-axis. In other embodiments, the cross-sectional shapes of the inner and outer conductors 302, 304 may gradually change along the Z-axis at a linear or non-linear rate, or may step-up or step-down along the Z-axis.

In the illustrated embodiment, the inner conductor 302 is concentric with the outer conductor 304 and the longitudinal axis 390 such that the TL resonator 301 is a coaxial transmission line resonator (CTLR). In other embodiments, however, the inner conductor 302 and the outer conductor 304 are not concentric.

Similar to the inner and outer conductors 302, 304, the cavity 306 may have a cross-sectional profile taken along the XY plane. The cross-sectional profile may have a variety of dimensions based on the cross-sectional shapes of the inner and outer conductors 302, 304. Depending upon the desired power, the area of the cross-sectional profile may be between a few square millimeters (e.g., for low power applications) and one or more square meters (e.g., for high power applications).

The inner conductor 302 and the outer conductor 304 are electrically connected at a proximal end 312 of the TL resonator 301. As used herein, the term "electrically connected" means two conductive elements are connected such that a conductive path is established for current flow between the two conductive elements. The two conductive elements may be directly attached to each other (e.g., welded to each other) or may have an intervening conductive pathway therebetween (e.g., through a conductive wire). In FIG. 6, the inner conductor 302 is electrically connected to the outer conductor 304 through the proximal-end wall 314 of the outer conductor 304. The proximal-end wall 314 may be referred to as the shorting plane. The inner conductor 302 is not mechanically connected to the outer conductor 304 at the distal-end wall 310. The inner conductor 302 does not electrically connect to the distal-end wall 310 and, as such, is open-ended proximate to the distal-end wall 310. More specifically, an end of the inner conductor 302 is closer to the distal-end wall 310 than the proximal end-wall 314. For example, a gap 326 exists between a conductive surface 374 that is electrically connected to the outer conductor 304 and a conductive surface 372 that is electrically connected to the inner conductor 302. More specifically, the gap 326 exists between a surface of the distal-end wall 310 and a surface forming a capacitive element 330.

At resonance, the RF voltage and the E-field will be at a maximum at the open end of the inner conductor 302 and essentially zero at the shorting plane. In the illustrated embodiment, the open end is effectively located at the capacitive plate 332, and the shorting plane corresponds to the proximal-end wall 314. The voltage and the E-field increase (e.g., exponentially) along the Z-axis from the shorting plane (or the proximal-end wall 314) to the open end (or the capacitive plate 332). The current and magnetic field (H-field) will be at a maximum at the shorting plane and essentially zero at the open end. The current and the H-field increase (e.g., exponentially) along the Z-axis from the open end to the shorting plane.

The geometry of the TL resonator 301 may be configured to achieve a designated electrical performance. For example, a characteristic impedance ($Z_O$) can be varied along the Z-axis to achieve a specific property or a combination of properties. A change in $Z_O$ will change a distribution of the E-field and a distribution of the H-field. The geometry may also be configured for mechanical reasons, such as enabling an easier method of attaching the TL resonator 301 to another structure, or for spatial requirements, such as being able to position the TL resonator 301 within a confined space or to incorporate a frequency tuning device. In some embodiments, an electrical length of the TL resonator 301 may be reduced for the same resonance frequency by increasing a diameter of the inner conductor 302 proximate to the open end or reducing a diameter of the outer conductor 304 proximate to the open end.

Also shown in FIG. 6, the inner conductor 302 and the outer conductor 304 are capacitively coupled by a surface of the capacitive element 330 that faces the distal-end wall 310. As shown, the capacitive element 330 includes a capacitive plate 332 that is connected to the inner conductor 302 and isolated from the distal-end wall 310 (and outer conductor 304) by the insulating medium 325. The capacitive plate 332 and the distal-end wall 310 are separated by the gap 326. In other embodiments, the capacitive plate 332 may capacitively couple to the outer conductor 304 more directly (e.g., not through the distal-end wall). For example, a broad side of the capacitive plate 332 may face radially away from the longitudinal axis 390 toward the outer conductor 304. Alternatively or in addition to the capacitive plate 332, a capacitive plate may be connected to the outer conductor 304. For example, one or more capacitive plates may capacitively couple the inner conductor 302 and the outer conductor 304. In other embodiments, a discrete capacitor (e.g., conventional off-the-shelf capacitor) may extend across the gap 326. More specifically, the discrete capacitor may be electrically connected to each of the inner conductor 302 and the distal-end wall 310 (or the outer conductor 304) to capacitively couple the inner conductor 302 and the distal-end wall 310 (or the outer conductor 304).

Capacitance provided by a capacitive plate may shorten a length of the TL resonator or the inner-conductor length. As one example, the TL resonator 301 may have an inner-conductor length 303 of 2.57 meters (m) for a resonance frequency of 29 MHz with a characteristic impedance of 75 ohm. In this example, the gap 326 includes air, which has a relative permittivity of 1.0, and the gap 326 is 0.001 m between the conductive surfaces. The area of the capacitive plate 332 is 0.022 meters-squared ($m^2$). In such a configuration, the capacitive plate 332 alone (with no added dielectric material between the capacitive plate 332 and the distal-end wall) yields a capacitance of approximately 0.19 nF. This capacitance may shorten the inner-conductor length 303 from 2.57 m to 0.6 m (or by 77%) for the same resonance frequency of 29 MHz.

Additional capacitance may further shorten the inner-conductor length and, consequently, a length or height of the TL resonator. For the same area and separation distance that defines the gap 326, capacitance will increase as the relative permittivity increases. In the illustrated embodiment, a dielectric material 334 (other than the insulating medium 325) is positioned within the gap 326. More specifically, a dielectric plate or disc 336 is inserted between the capacitive element 330 (or the capacitive plate 332) and the outer conductor 304 to increase the capacitance. The capacitance added by the dielectric material 334 may further shorten the length of the TL resonator 301 or the inner-conductor length 303. For example, the dielectric plate 336 in FIG. 6 may be a layer of polytetrafluoroethylene (PTFE) that has an area of 0.022 meters-squared ($m^2$), a relative permittivity of 2.1, and a thickness of 0.001 m. In the illustrated embodiment, the characteristic impedance is 75 ohm. The capacitive plate 332 and the dielectric plate 336 provide an added capacitance of 0.4 nF within the gap 326 and shorten the inner-conductor length 303 to 0.3 m (or by 88%) for the same resonance frequency of 29 MHz. When the physical length of a TL resonator is shorter than QW, the TL resonator will appear inductive and be brought to resonance with the added capacitance. The capacitance provided by the capacitive element 330 and the additional capacitance may provide the compensation capacitance as described herein.

An approximate length of the capacitively-compensated QW resonator may be a function of the wave propagation speed, the desired fundamental frequency, the added capacitance, and the characteristic impedance of the transmission line. The reduced length will come at the cost of a decrease in bandwidth.

Figure 7:
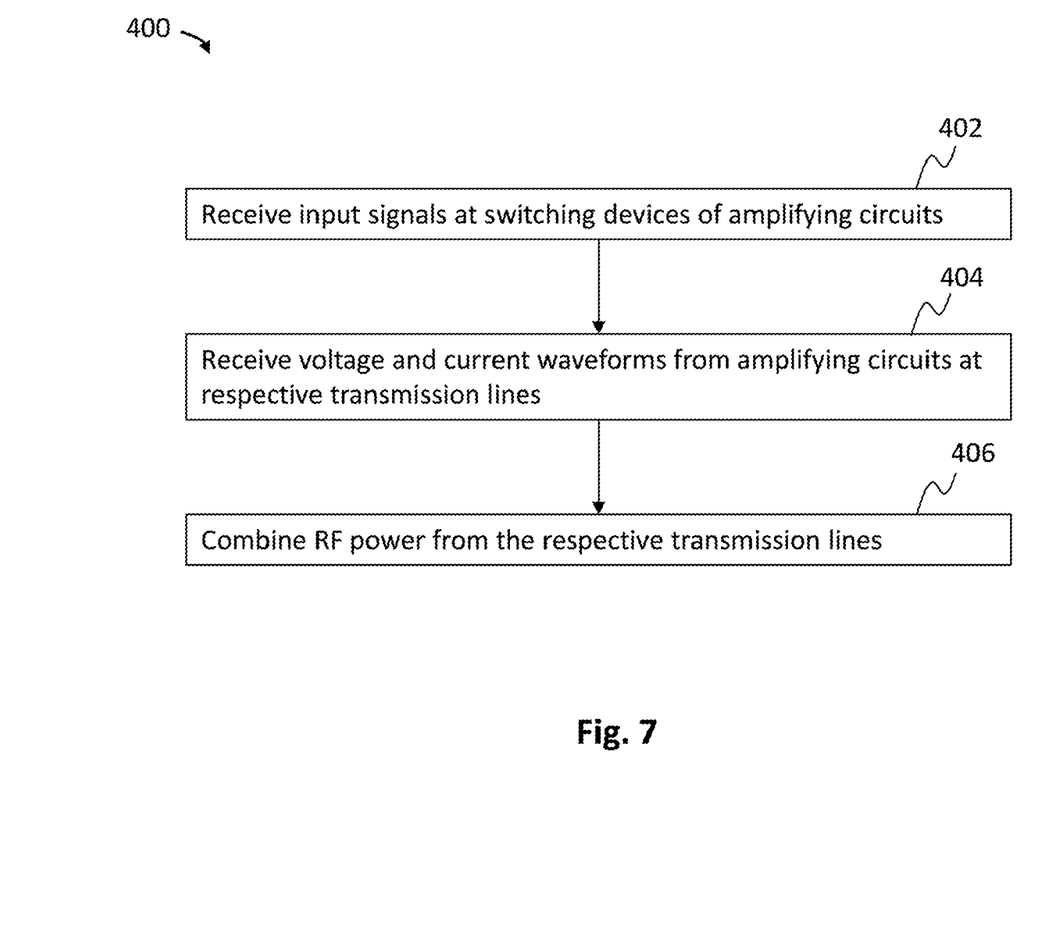
FIG. 7 is a block diagram illustrating a method of amplifying and combining RF power to a load in accordance with an embodiment.

FIG. 7 is a flowchart illustrating a method 400 in accordance with an embodiment. The method 400 includes receiving, at 402, input signals at respective switching devices of first and second amplifying circuits. The switching devices provide voltage and current waveforms. The method also includes receiving, at 404, the voltage and current waveforms from the first and second amplifying circuits at first and second transmission lines, respectively. Optionally, the first and second transmission lines may cause a load impedance transformation. The method also includes combining, at 406, RF power from the first and second transmission lines using a capacitively-compensated transmission line resonator (CC-TLR). The CC-TLR has a compensation capacitance that causes the CC-TLR to present an open circuit at the fundamental frequency and present a short circuit at harmonic frequencies. The CC-TLR being connected to a load.

The CC-TLR may be resonant at the fundamental frequency. Optionally, the CC-TLR may be a quarter-wavelength of the fundamental frequency or shorter than a quarter-wavelength. More specifically, the CC-TLR may have an electrical length corresponding to a quarter-wavelength standing wave at the fundamental frequency or a shorter length. By way of example, the fundamental frequency may be between 10 MHz and 300 MHz.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 312(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A system comprising:
   first and second amplifying circuits configured to receive input signals having a fundamental frequency, the first and second amplifying circuits having respective switching devices configured to provide voltage and current waveforms;
   first and second transmission lines configured to receive the voltage and current waveforms from the first and second amplifying circuits, respectively, wherein electrical lengths of the first and second transmission lines are a quarter-wavelength of the fundamental frequency; and
   a capacitively-compensated transmission line resonator (CC-TLR) configured to be electrically connected to a load having a load impedance, the CC-TLR configured to receive and combine RF power from the first and second transmission lines, wherein the CC-TLR has a compensation capacitance that causes the CC-TLR to present an open circuit at the fundamental frequency and present a short circuit at harmonic frequencies.

2. The system of claim 1, wherein a characteristic impedance ($Z_0$) of the first and second transmission lines and the load impedance ($Z_L$) are unequal, the first and second transmission lines causing a load impedance transformation.

3. The system of claim 1, wherein a characteristic impedance ($Z_0$) of the first and second transmission lines and the load impedance ($Z_L$) are equal.

4. The system of claim 1, wherein the CC-TLR is resonant at the fundamental frequency, wherein the compensation capacitance reduces a length of the CC-TLR.

5. The system of claim 4, wherein the fundamental frequency is between 10 megahertz (MHz) and 300 MHz.

6. The system of claim 1, wherein the compensation capacitance of the CC-TLR adjusts the resonance of the CC-TLR to resonate in between adjacent harmonic frequencies of the fundamental frequency.

7. The system of claim 1, further comprising at least one additional amplifying circuit and a respective transmission line for each additional amplifying circuit, the respective transmission line configured to receive voltage and current waveforms from the additional amplifying circuit, wherein the CC-TLR is configured to receive and combine RF power from the first and second transmission lines and the respective transmission line.

8. The system of claim 1, wherein each of the first and second transmission lines includes a plurality of transmission lines connected in series and having different characteristic impedances.

9. The system of claim 1, wherein the transmission line resonator of the CC-TLR includes a coaxial transmission line resonator.

10. The system of claim 1, wherein the CC-TLR includes first and second input coupling elements and at least one output coupling element, the first and second input coupling elements receiving the RF power from the first and second transmission lines, respectively, the CC-TLR combining the RF power received from the first and second input coupling elements.

11. The system of claim 1, wherein the first and the second transmission lines are each a multiple of a quarter-wavelength at odd harmonics and are each a multiple of a half-wavelength at even harmonics, the first and the second transmission lines transforming the load impedance at the fundamental frequency.

12. A system comprising:
   first and second amplifying circuits configured to receive input signals having a fundamental frequency, the first and second amplifying circuits having respective switching devices configured to provide voltage and current waveforms;
   first and second transmission lines configured to receive the voltage and current waveforms from the first and second amplifying circuits, respectively, wherein electrical lengths of the first and second transmission lines are a quarter-wavelength of the fundamental frequency; and a capacitively-compensated transmission line resonator (CC-TLR) configured to be electrically connected to a load having a load impedance, the CC-TLR configured to receive and combine RF power from the first and second transmission lines, wherein the CC-TLR has a compensation capacitance that causes the CC-TLR to present an open circuit at the fundamental frequency and present a short circuit at harmonic frequencies, wherein the CC-TLR includes:

an inner conductor, an outer conductor that surrounds the inner conductor, and a cavity between the inner conductor and the outer conductor, wherein the inner conductor and the outer conductor are electrically connected at a proximal end of the CC-TLR; and a capacitive element connected to at least one of the inner conductor or the outer conductor, the capacitive element capacitively coupling the inner conductor and the outer conductor.

13. The system of claim 12, wherein the capacitive element capacitively couples the inner conductor and the outer conductor at a distal end of the CC-TLR.

14. The system of claim 12, wherein the CC-TLR extends lengthwise along a longitudinal axis, the capacitive element including a first conductive surface that is electrically connected to the inner conductor and a second conductive surface that is electrically connected to the outer conductor, the first and second conductive surfaces facing each other and being separated by a gap, wherein at least one of a gas or a dielectric material is disposed within the gap.

15. A system comprising:

an amplifying circuit configured to receive input signals having a fundamental frequency, the amplifying circuit having a switching device configured to provide voltage and current waveforms;

a transmission line configured to receive the voltage and current waveforms from the amplifying circuit, wherein an electrical length of the transmission line is a quarter-wavelength of the fundamental frequency; and a capacitively-compensated transmission line resonator (CC-TLR) configured to be electrically connected to a load having a load impedance, the CC-TLR configured to receive RF power from the transmission line, wherein the CC-TLR has a compensation capacitance that causes the CC-TLR to present an open circuit at the fundamental frequency and present a short circuit at harmonic frequencies.

16. The system of claim 15, wherein the characteristic impedance ($Z_O$) of the transmission line and the load impedance ($Z_L$) are unequal, the transmission line causing a load impedance transformation.

17. The system of claim 15, wherein the CC-TLR is resonant at the fundamental frequency and the fundamental frequency is between 10 megahertz (MHz) and 300 MHz.

18. The system of claim 15, wherein the transmission line includes a plurality of transmission lines connected in series and having different characteristic impedances.

19. The system of claim 15, wherein the CC-TLR includes:

an inner conductor, an outer conductor that surrounds the inner conductor, and a cavity between the inner conductor and the outer conductor, wherein the inner conductor and the outer conductor are electrically connected at a proximal end of the CC-TLR; and a capacitive element connected to at least one of the inner conductor or the outer conductor, the capacitive element capacitively coupling the inner conductor and the outer conductor.

20. The system of claim 19, wherein the CC-TLR extends lengthwise along a longitudinal axis, the capacitive element including a first conductive surface that is electrically connected to the inner conductor and a second conductive surface that is electrically connected to the outer conductor, the first and second conductive surfaces facing each other and being separated by a gap, wherein at least one of a gas or a dielectric material is disposed within the gap.

* * * * *